United States Patent
Kim

(10) Patent No.: US 7,149,112 B2
(45) Date of Patent: Dec. 12, 2006

(54) SEMICONDUCTOR MEMORY DEVICE WITH SIGNAL LINES ARRANGED ACROSS MEMORY CELL ARRAY THEREOF

(75) Inventor: Chan-Ho Kim, Ansan-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/976,512

(22) Filed: Oct. 29, 2004

(65) Prior Publication Data

US 2005/0259466 A1 Nov. 24, 2005

(30) Foreign Application Priority Data

May 18, 2004 (KR) .................. 10-2004-0035019

(51) Int. Cl.
*G11C 11/34* (2006.01)
*G11C 5/06* (2006.01)

(52) U.S. Cl. .................. 365/185.05; 365/63

(58) Field of Classification Search .......... 365/63, 365/185.05; 257/210, 211, 691, 920, 659, 257/664
See application file for complete search history.

(56) References Cited

U.S. PATENT DOCUMENTS

| | | | |
|---|---|---|---|
| 5,184,321 A * | 2/1993 | Konishi et al. | 365/51 |
| 6,150,728 A * | 11/2000 | Tsukude et al. | 257/786 |
| 6,320,785 B1 * | 11/2001 | Yoshida et al. | 365/185.03 |
| 6,339,541 B1 * | 1/2002 | Hardee et al. | 365/63 |
| 6,654,283 B1 * | 11/2003 | Haddad | 365/185.17 |
| 6,762,949 B1 * | 7/2004 | Fujisawa et al. | 365/63 |

FOREIGN PATENT DOCUMENTS

| | | |
|---|---|---|
| JP | 11-261036 | 9/1999 |
| JP | 2001-274366 | 5/2001 |
| JP | 2002-261174 | 9/2002 |
| KR | 10-2003-0032858 | 4/2003 |

OTHER PUBLICATIONS

English Abstract Only *** Nonvolatile Semiconductor memory Mar. 10, 1998.
English Abstract Only *** Nonvolatile Semiconductor Memory Device and Producing method therefor Mar. 28, 2000.
English Abstract Only *** Manufacturing Method of Nonvolatile Semiconductor memory Mar. 02, 2001.
English Abstract Only *** Self Aligned Method of forming semicondoctor memory array of floating gate Oct. 16, 2002.

* cited by examiner

*Primary Examiner*—Amir Zarabian
*Assistant Examiner*—Anthan Tran
(74) *Attorney, Agent, or Firm*—F.Chau & Associates, LLC

(57) ABSTRACT

A semiconductor memory device comprises a memory cell array including a plurality of data storage regions having a plurality of memory cells and a plurality of dummy regions occupying space between the plurality of data storage regions, at least one peripheral logic arranged around the memory cell array, and a control logic for controlling operations of the peripheral logic, wherein a plurality of signal lines for connecting the peripheral logic and the control logic are arranged in the plurality of dummy regions.

14 Claims, 8 Drawing Sheets

SEMICONDUCTOR MEMORY DEVICE WITH SIGNAL LINES ARRANGED ACROSS MEMORY CELL ARRAY THEREOF

CROSS-REFERENCE TO RELATED APPLICATION

This application claims priority to Korean Patent Application No. 2004-35019, filed on May 18, 2004, in the Korean Intellectual Property Office, the disclosure of which is herein incorporated by reference in its entirety.

TECHNICAL FIELD

This disclosure relates to semiconductor devices and, more particularly, to an efficient arrangement of signal lines for a flash memory device.

BACKGROUND

In general, non-volatile memory devices can store data even when power is not provided. A flash memory may electrically erase data of cells at a time. Thus, the flash memory has been widely used in computers and memory cards.

The flash memory includes two types of memory: a NOR-type flash memory and a NAND-type flash memory. In the NOR-type flash memory, two or more cell transistors are connected to a bit line in parallel. In the NAND-type flash memory, two or more cell transistors are connected to a bit line in series. The NOR-type flash memory stores data using a channel hot electron method and erases the data using Fowler-Nordheim tunneling (F-N tunneling) method. The NAND-type flash memory stores and erases data using F-N tunneling method. Generally, the NOR-type flash memory may be unsuitable for highly integrated semiconductor devices due to high power consumption of the NOR-type flash memory. Thus, even though the NOR-type flash memory can access with high-speed easily, the NAND-type flash memory consuming smaller cell current as compared to the NOR-type flash memory device is preferred in highly integrated semiconductor devices.

FIG. 1 is a block diagram showing a structure of a conventional NAND-type flash memory 100 disclosed in U.S. Pat. No. 6,288,936 with reference numerals added for the convenience of explanation.

Referring to FIG. 1, the NAND-type flash memory 100 includes a NAND-type memory cell array 110 in which a plurality of cell transistors are connected to one bit line in series. First and second page buffers 122 and 124 are connected to top and bottom of the memory cell array 110 respectively. A page buffer control unit 130 controls an operation of the first and the second page buffers 122 and 124. A main control unit 140 controls operations of the NAND-type flash memory 100. An Input-Output (I/O) Buffer 150 stores input/output data of each of the first and the second page buffers 122 and 124.

The first page buffer 122 is connected to even-numbered bit lines (BL0, BL2, BL4, . . . ) of the memory cell array 110. The second page buffer 124 is connected to odd-numbered bit lines (BL1, BL3, BL5, . . . ).

The page buffer control unit 130 generates control signals under a control of the main control unit 140. The first and the second page buffers 122 and 124 transmit program data to the memory cell array 110 in response to control signals generated from the buffer control unit 130. The first and the second page buffers 122 and 124 also read data from the memory cell array 110. For instance, if data is read from the flash memory, the read data of pertinent page is transferred from the memory cell array 110 to the first and the second page buffers 122 and 124. Then the data is outputted as 1 Byte (8 bits) to the I/O buffer 150 according to an address of a column. Generally, a program or read operation of this NAND-type flash memory is performed by a page unit. An erase operation of the programmed data is performed in a block unit assembled with several pages. For example, in a 32 Mb flash memory, one page is configured with 512 B+16 B (a spare region), and one block is configured with 32 pages. Thus, the 32 Mb flash memory is made with 2,048 blocks.

In the flash memory 100 shown in FIG. 1, a plurality of control signals 10 are sent/received between the page buffer unit 130, and the first and the second page buffers 122 and 124. The page buffers 122 and 124 are disposed in top and bottom of the memory cell array 110. Data 20 is also sent/received between the first and the second page buffers 122 and 124, and the IO buffer 150. A plurality of signal lines for sending/receiving a plurality of control signals and/or data are disposed among the first and the second page buffers 122 and 124, the page buffer control unit 130 and the I/O buffer 150. Generally, in conventional technology, control logics such as the page buffer control unit 130 and the I/O buffer 150 are located under the memory cell array 110 in the flash memory 100. However, as shown in FIG. 1, when the page buffers 122 and 124 are located top and bottom of the memory cell array 110, respectively, it is preferable to have a plurality of control signals to be transmitted to the page buffers 122 and 124 to be provided from a peripheral logic located under the memory cell array 110.

In FIG. 1, a plurality of signal lines 10 connected to the first and the second page buffers 122 and 124 are arranged by partially assigning an edge region of a flash memory chip 100. An occupying area of signal lines on the chip is determined depending on the width and specification of signal lines. The conventional arrangement of this signal lines may increase a chip size of the flash memory 100 because additional regions need to be assigned on the flash memory chip for signal lines. Furthermore, since the length of an interconnection connected to the respective page buffer may be different, a skew may occur. Thus, predictions for signal transformations may be difficult.

For arranging the signal lines on the flash memory chip in different manner, the control logic (e.g., the page buffer unit 130 or the I/O buffer 150) may be set at center of the chip. However, the flash memory chip size may also increase because an additional region on the flash memory chip for arranging the signal lines is needed. In addition, it may be difficult to embody cut-down version used by a memory capacitance because the control logic is located at the center of the flash memory chip.

SUMMARY OF THE INVENTION

According to exemplary embodiments of the present invention, a semiconductor memory device is arranged directly across a memory cell array instead of assigning additional areas to arrange signal lines for transferring control signals and data. In addition, the semiconductor memory device shields signal lines using a metal layer formed on a lower layer of the arranged signal lines. As a result, the signal lines occupy minimal space on a chip, and data interference between the memory cell array and the signal lines can be prevented.

In an exemplary embodiment of the present invention, a semiconductor memory device comprises a memory cell array including a plurality of data storage regions having a plurality of memory cells and a plurality of dummy regions occupying space between the plurality of data storage regions, at least one peripheral logic arranged around the memory cell array, and a control logic for controlling operations of the peripheral logic, wherein a plurality of signal lines for connecting the peripheral logic and the control logic are arranged in the plurality of dummy regions. The plurality of dummy regions comprises a common source region connected to a common source line of the memory cell array, and a ground region for shielding the plurality of signal lines. The common source region and the ground region are formed in a first metal layer. The plurality of signal lines comprises one ground line connected to the ground region and one or more data lines, and one or more control lines. The plurality of signal lines have a regular length to predict a signal transformation with respect to each of the signal lines. The plurality of signal lines are formed in a second metal layer. The second metal layer further comprises another common source region connected to the common source region formed in the first metal layer through a plurality of contacts. The memory cell array is a flash memory cell array. The plurality of data storage regions are a cell string group of a flash memory including a plurality of memory cell strings comprising a plurality of memory cells.

In another exemplary embodiment of the present invention, a memory cell array comprises a plurality of data storage regions comprising a plurality of memory cells, and a plurality of signal transfer regions connected to a common source line of the plurality of data storage regions, wherein a plurality of signal lines are arranged in each of the plurality of signal transfer regions. The signal transfer region comprises a common source region connected to a common source line of the plurality of data storage region, and a ground region for shielding the plurality of signal lines. The common source region and the ground region are formed in a first metal layer. The plurality of signal lines comprise one ground line connected to the ground region, and one or more control lines, and one or more data lines.

The plurality of signal lines have a regular length to predict a signal transformation with respect to each of the plurality of signal lines. The plurality of signal lines are formed in a second metal layer. The second metal layer further includes another common source region connected to the common source region included in the first metal layer through a plurality of contacts. The memory cell array is a flash memory cell array. The plurality of data storage regions are a memory cell string group of a flash memory including a plurality of memory cell strings comprising a plurality of memory cells.

These and other exemplary embodiments, features and advantages of the present invention will become more apparent by describing in detail exemplary embodiments thereof with reference to the attached drawings.

DESCRIPTION OF EXEMPLARY
EMBODIMENTS

Exemplary embodiments of the present invention will now be described more fully with reference to the accompanying drawings. This invention may, however, be embodied in many different forms and should not be construed as being limited to the embodiments set forth herein. Rather, these embodiments are provided so that this disclosure will be through and complete, and will fully convey the concept of the invention to those skilled in the art.

According to exemplary embodiments of the present invention, a semiconductor memory device is arranged directly across a memory cell array instead of assigning additional areas to arrange signal lines for transferring control signals and data. The semiconductor memory device shields signal lines using a metal layer formed on a lower layer of the arranged signal lines. The signal lines occupy the minimal space on a chip, and data interference between the memory cell array and the signal lines can be prevented.

With highly integrated semiconductor devices, design rule and chip size become decreased. Suppressing a signal delay by RC as well as stably supplying power is needed. To satisfy these requests, recent flash memories employ strapping technique that connects memory cells and a metal layer cyclically.

Strapping technique has been used to provide a plurality of electrical connections successively arranged to memory cell elements to secure an equalized voltage with respect to elements (e.g., a source, a drain, a control gate and a floating gate) of all memory cells in a target row/column. "METHOD OF FORMING A SEMICONDUCTOR ARRAY OF FLOATING GATE MEMORY CELLS HAVING STRAP REGIONS AND PERIPHERAL LOGIC DEVICE REGION" is disclosed in U.S. Pat. No. 6,541,324 by Wang et al. A plurality of strapping regions may be arranged in a large sized memory cell array.

Figure 2:
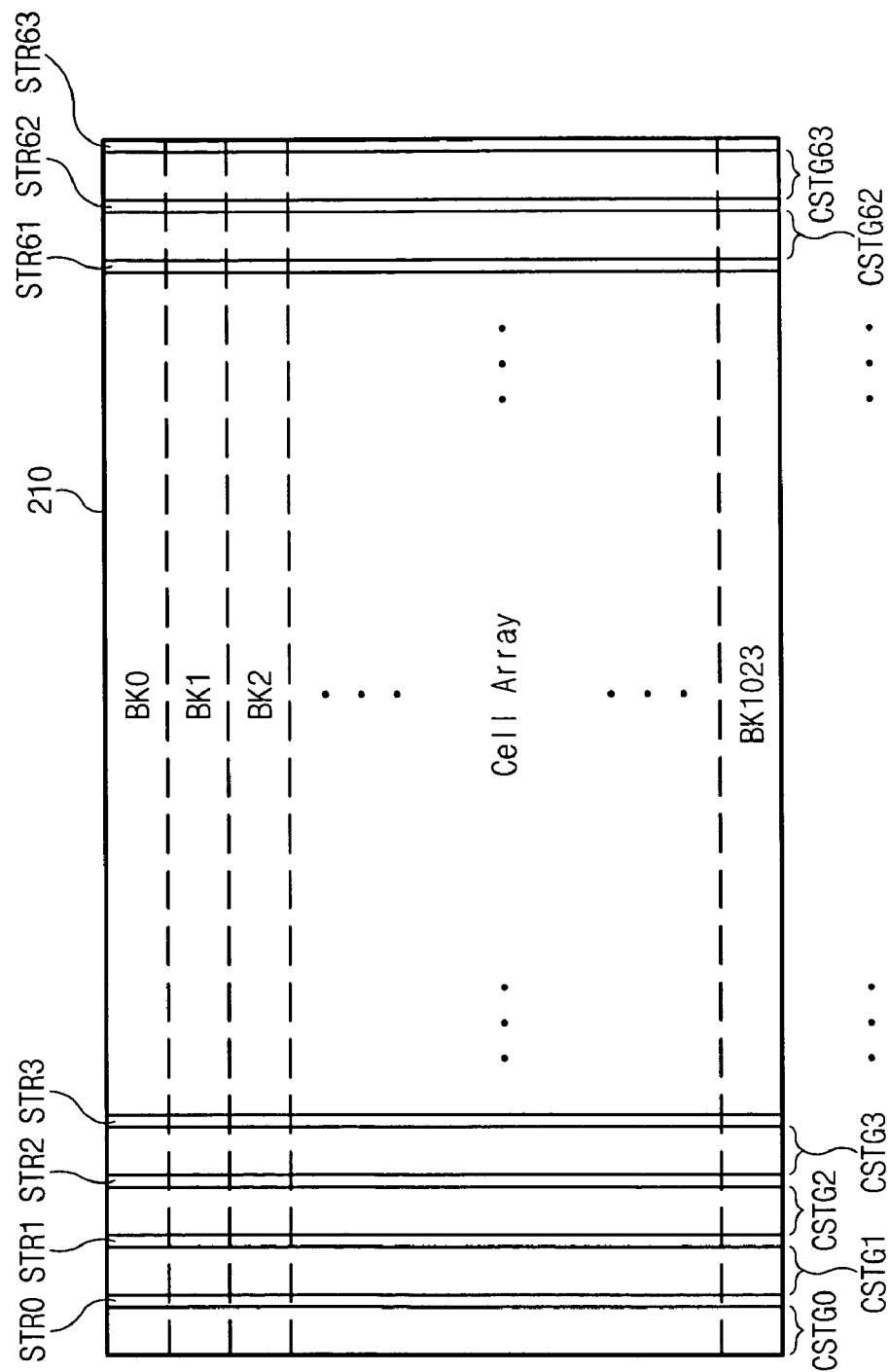
FIG. 2 is a schematic diagram of a flash memory cell array including a plurality of strapping regions.
Figure 3:
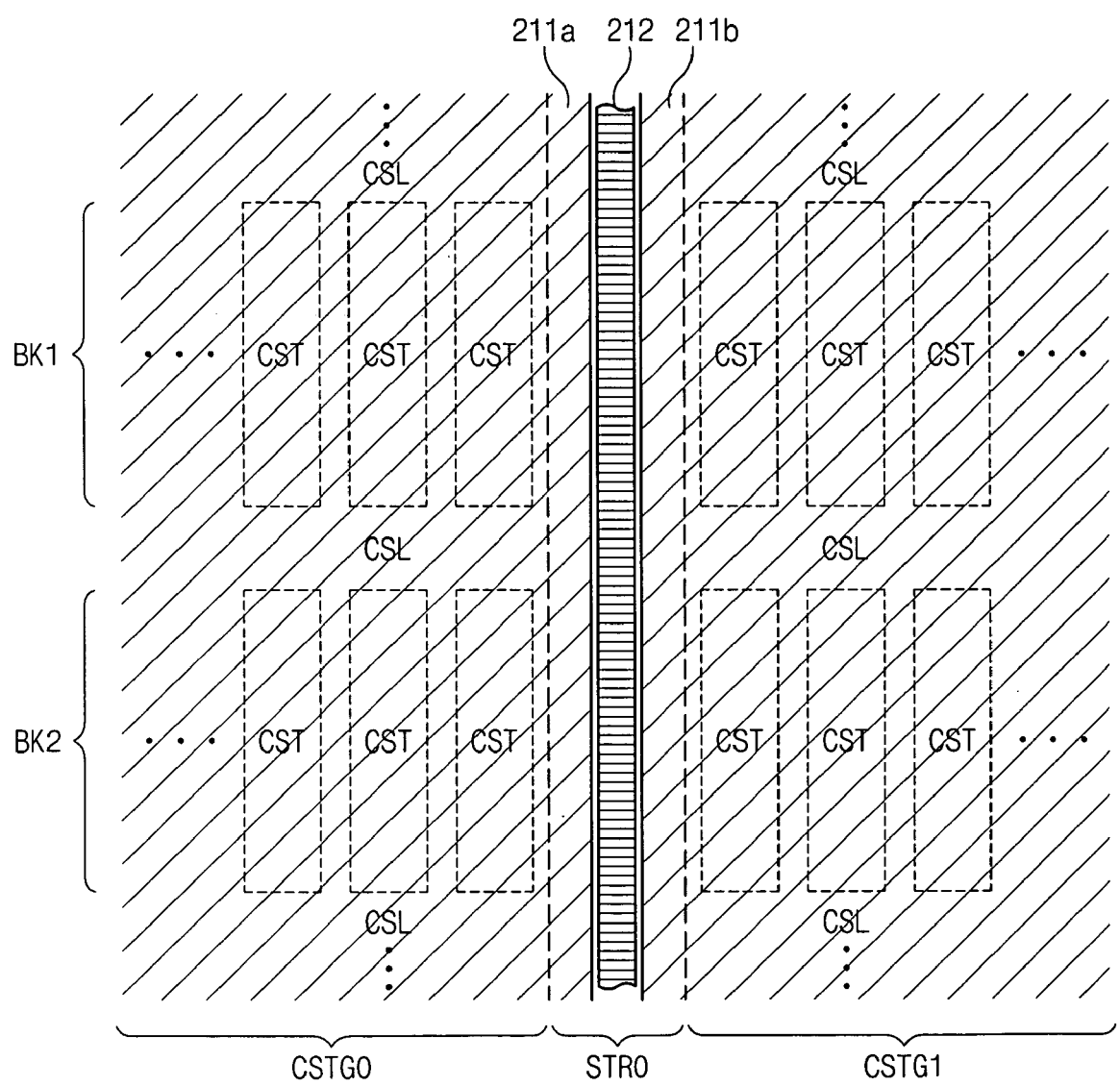
FIG. 3 is a diagram of the cell array of FIG. 2.

FIG. 2 shows a schematic diagram of a flash memory cell array including a plurality strapping regions according to an exemplary embodiment of the present invention. FIG. 3 shows a diagram of a cell array of FIG. 2.

Referring to FIGS. 2 and 3, a memory cell array 210 of a flash memory includes a plurality of cell string groups (CSTG0, CSTG1, . . . ) and a plurality of strapping regions (STR0, STR1, . . . ) arranged between the cell string groups (CSTG0, CSTG1, . . . ). The cell string groups (CSTG0, CSTG1, . . . ) comprise a plurality of cell strings CST corresponding to a plurality bit lines. The construction of the strapping regions (STR0, STR1, . . . ) may be changed depending on a design method. Preferably, in a memory cell array, the strapping regions may be formed as many numbers as internal I/Os of a flash memory.

The strapping regions (STR0, STR1, . . . ) include common source regions 211a and 211b connected to a common source line CSL of the memory cell array 210, and a Well Drive Line WDL 212 for connecting a well region to the memory cell array 210. In an exemplary embodiment of the present invention, the common source regions 211a and 211b may be used to solve problems such as resistance increment and signal delay with increasing a memory size. The well drive line WDL may be used to prevent voltage drop during programming and erasing a memory as well as to uniformly provide a voltage. A plurality of word lines (not shown) are arranged in vertical to the well drive line WDL on a lower layer of the well drive line WDL.

The common source regions 211a and 211b of FIG. 3 occupies a region excluding space occupied by the well drive line 212 among the strapping regions (STR0, STR1, ...), and a metal layer formed on an upper portion of the cell string groups (CSTG0, CSTG1, ...) (see oblique regions of FIG. 3). The common source regions 211a and 211b and the well drive line 212 disposed in the strapping regions (STR0, STR1, ...) are formed on the same metal layer. The common source regions 211a and 211b and the well drive line 212 are constructed to maintain a uniform distance. The strapping regions (STR0, STR1, ...) are disposed on the memory cell array 210. An active region is not disposed on the memory cell array 210 (see FIGS. 7 and 8). Accordingly, the strapping regions (STR0, STR1, ...) are used as an interconnection region for connecting memory cells and a metal line.

Figure 1:
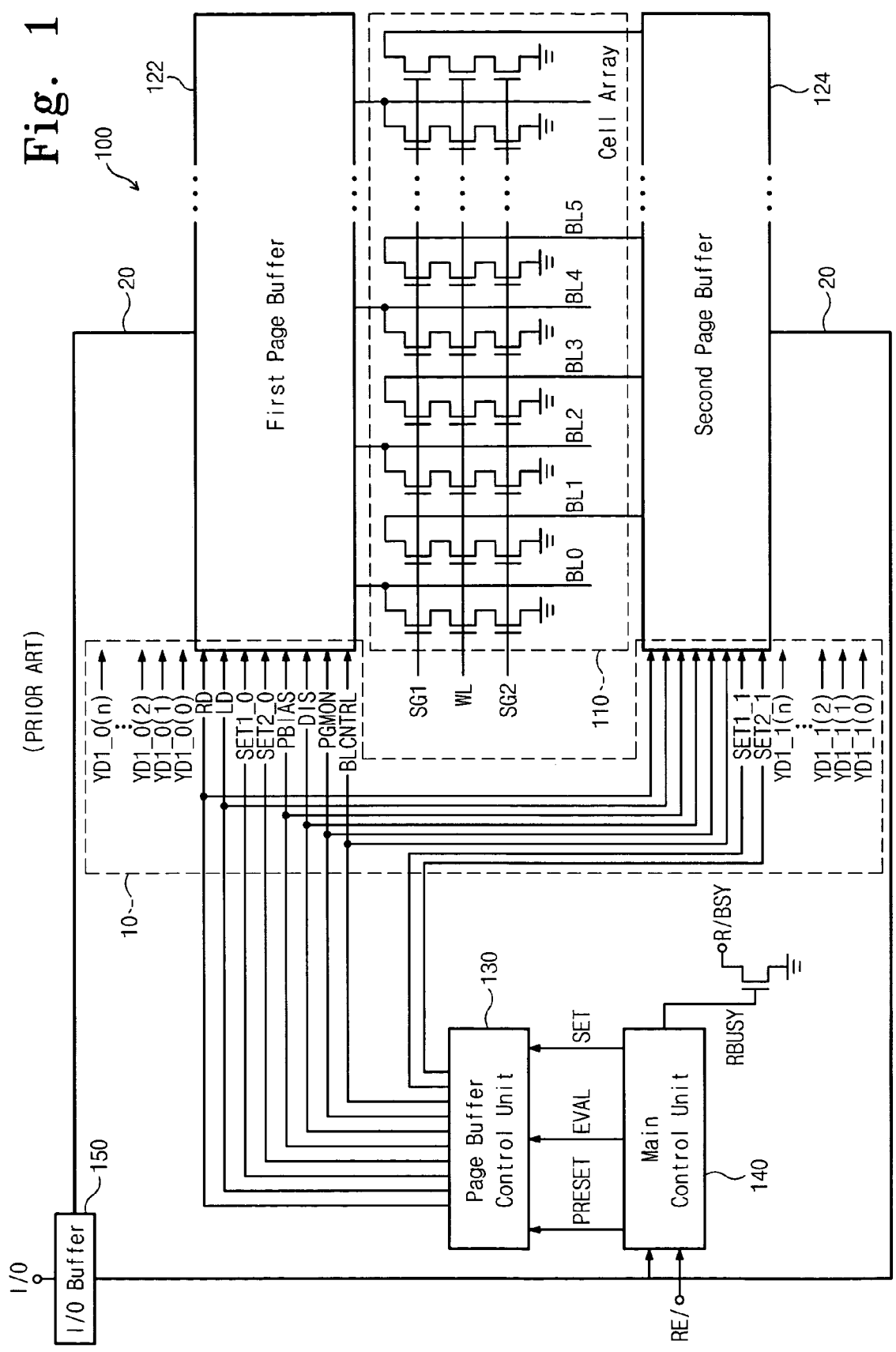
FIG. 1 is a block diagram showing a structure of a conventional NAND-type flash memory.

The strapping regions (STR0, STR1, ...) are used to arrange signal lines between the peripheral logic and a control logic according to an exemplary embodiment of the present invention. In other words, as shown in FIG. 1, if the peripheral logic and the control logic are arranged in a distance on a memory chip, the signal lines are arranged in the strapping regions (STR0, STR1, ...) assigned in the memory cell array 210 instead of assigning additional signal line areas on the memory chip to connect signal lines between the two logics. As a result, the signal lines may traverse the memory cell array 210 directly, and thereby minimizing spaces occupied by the signal lines. Signal delay may not occur when the signal lines have a regular distance.

A metal layer under the signal lines may shield the signal lines from the memory cell. As a result, data interference and noise between the memory cell array and the signal lines may be removed.

Figure 4:
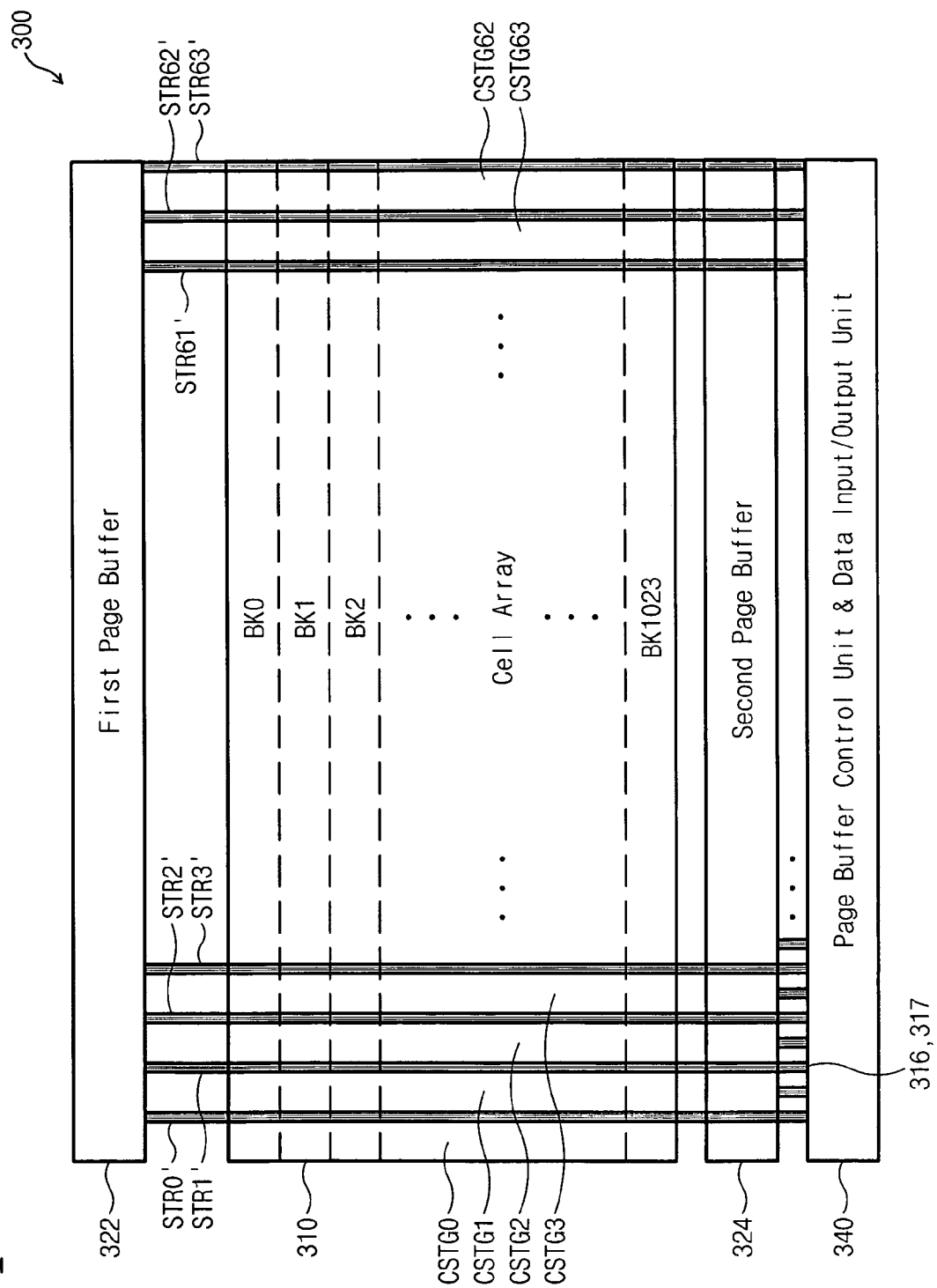
FIG. 4 is a schematic diagram showing a memory cell array structure of a flash memory device according to an exemplary embodiment of the present invention.

Referring to FIG. 4, the diagram shows a flash memory device 300 according to an exemplary embodiment of the present invention. The flash memory device 300 includes a plurality of memory cell string groups (CSTG0, CSTG1, ...), a memory cell array 310, first and second page buffers 322 and 324, and a page buffer control unit and data input/output unit 340. The memory cell array 310 includes a plurality of strapping regions (STR0', STR1', ...) occupying regular space. The first and the second page buffers 322 and 324 are located on upper and lower portions of the memory cell array 310, respectively. The page buffer control unit and data input/output unit 340 controls an operation of the first and the second page buffers 322 and 324. A plurality of signal lines for transmitting/receiving a plurality of control signals and data are connected between the page buffer control unit and data input/output unit 340, and the first and second page buffers 322 and 324. Signal lines 316 and 317 connected to the first page buffer 322 over the memory cell array 310 are located in the strapping regions (STR0', STR1', ...).

Figure 5:
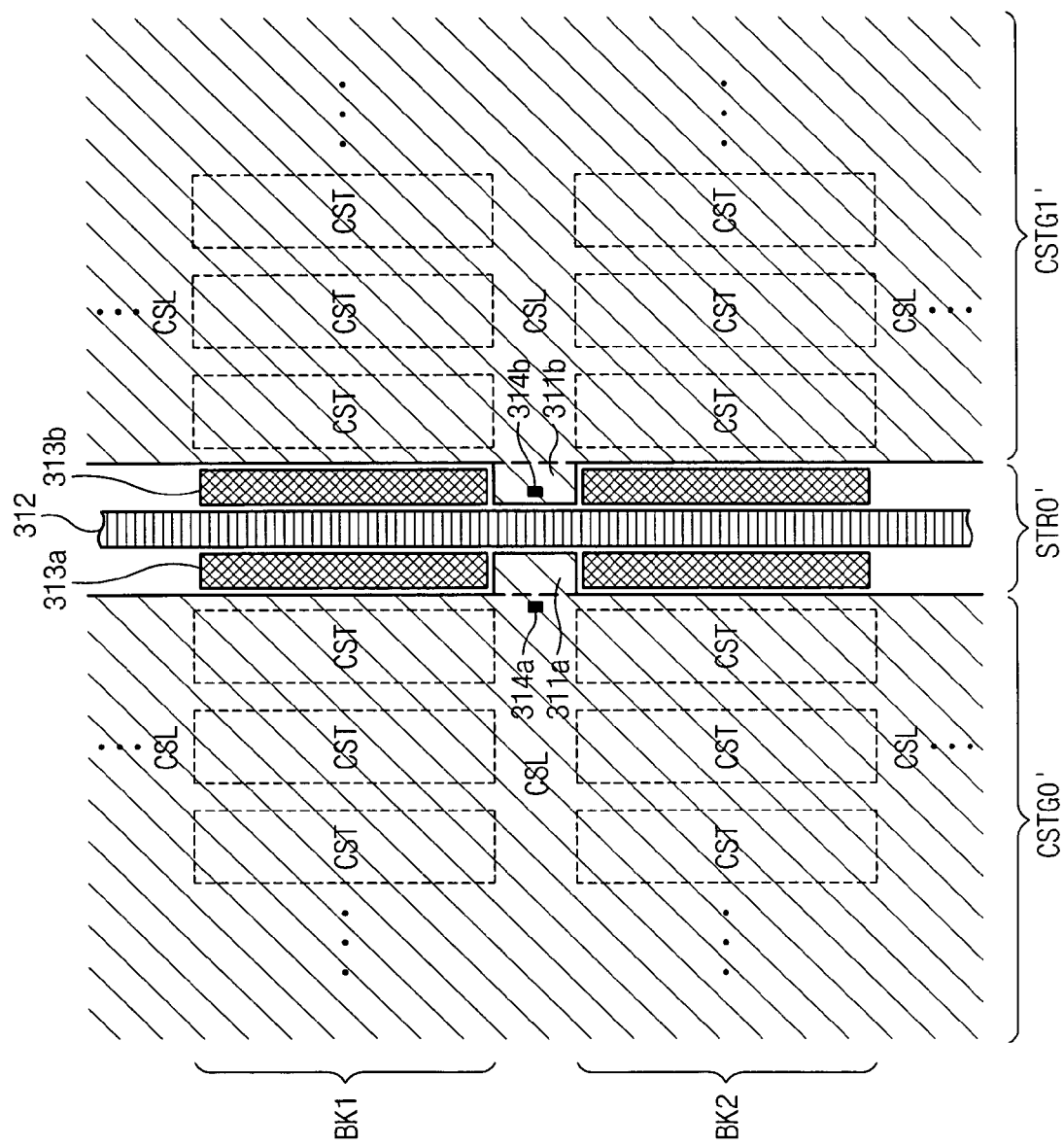
FIGS. 5 and 6 are diagrams showing the strapping regions of FIG. 4.

Referring to FIG. 5, the diagram shows a portion of the strapping regions (STR0', STR1', ...) according to exemplary embodiment of the present invention. A first metal layer METAL 1 of the strapping regions (STR0', STR1', ...) is shown as an oblique region. The strapping regions (STR0', STR1', ...) include common source regions 311a and 311b, a well drive line WDL 312, and ground regions 313a and 313b. The ground regions 313a and 313b shield signal lines arranged over the strapping regions (STR0', STR1', ...) from the memory cell. The common source regions 311a and 311b are connected to the common source line CSL of the memory cell array 310. The well drive line WDL 312 connects the memory cell array 310 and the well region. The ground regions 313a and 313b shield signal lines disposed over the strapping regions (STR0', STR1', ...). Since a plurality of contacts 314a and 314b are disposed in the common source regions 311a and 311b, the common source regions 311a and 311b and the common source line CSL under the common source regions 311a and 311b are connected through the plurality of contacts 314a and 314b. The ground regions 313a and 313b may be defined by residual regions excluding regions substantially connected to the common source line CSL among common source regions 211a and 211b shown in FIG. 3. The common source regions 311a and 311b include regular space assigned to the strapping regions (STR0', STR1', ...) and an upper region of memory cell strings (see oblique regions of FIG. 5).

These common source regions 311a and 311b, well drive line WDL 312, and the ground regions 313a and 313b may be formed in the same metal layer. Hereinafter, the layers including the common source regions 311a and 311b, the well drive line WDL 312, and the ground regions 313a and 313b are referred to as the first metal layer METAL 1.

After forming the first metal layer METAL 1, an intermetal dielectric (IMD) layer, i.e., an insulating layer, is formed on an upper portion of the first metal layer METAL 1. The intermetal dielectric (IMD) layer is an interlayer material of a semiconductor metal interconnection. Then, a second metal layer METAL 2 including signal lines 316 and 317 and the common source region 315 is formed over the IMD layer.

Figure 6:
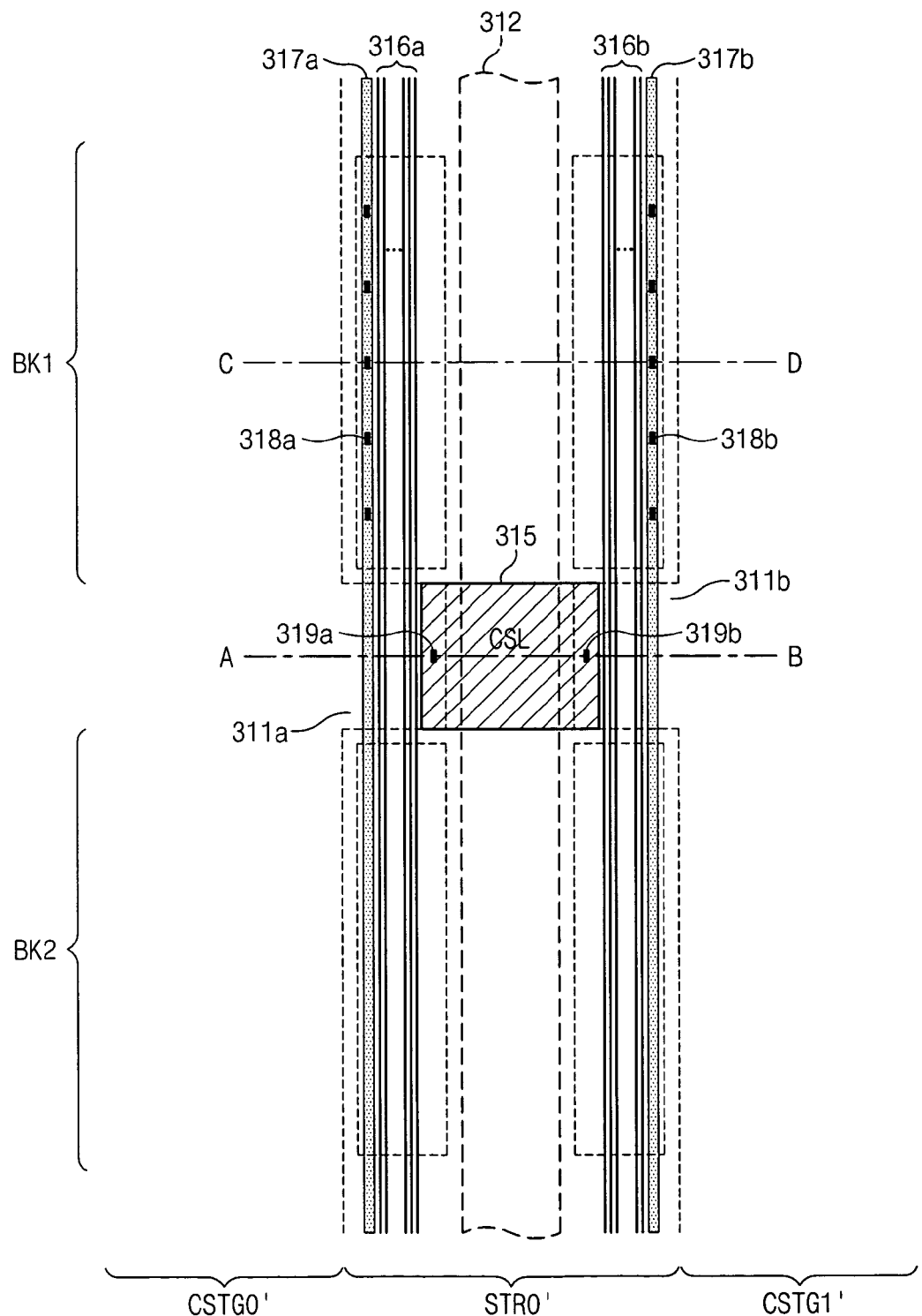

Referring to FIGS. 5 and 6, to secure a distance between the common source regions 311a and 311b and the well drive line WDL 312 formed in the first metal layer METAL 1, the common source regions 311a and 311b are formed at uniform distance at the center of the well drive line WDL 312. Preferably, the common source regions 311a and 311b may be connected in parallel. As shown in FIG. 6, a common source region 315 formed in the second metal layer METAL 2 is arranged additionally in the strapping regions (STR0', STR1', ...). The common source region 315 on the second metal layer METAL 2 is connected to the common source regions 311a and 311b formed on the first metal layer METAL 1 through the contacts 319a and 319b. The common source regions 311a, 311b and 315 can be formed in parallel.

A plurality of signal lines 316a, 316b, 317a and 317b are arranged on upper portions of the ground regions 313a and 313b formed in the first metal layer METAL 1. The plurality of signal lines 316a, 316b, 317a and 317b are parallel with strapping lines (STR0', STR1', ...), i.e., traverse the memory cell array over and below. The plurality of signal lines 316a, 316b, 317a and 317b include one or more ground lines (317a and/or 317b) and one or more signal line groups (316a and/or 316b). The plurality of signal lines 316a, 316b, 317a and 317b are made of one or more control lines and/or one or more data lines. In addition, the plurality of signal lines 316a, 316b, 317a and 317b may be controlled within the range of the design rule.

Figure 7:
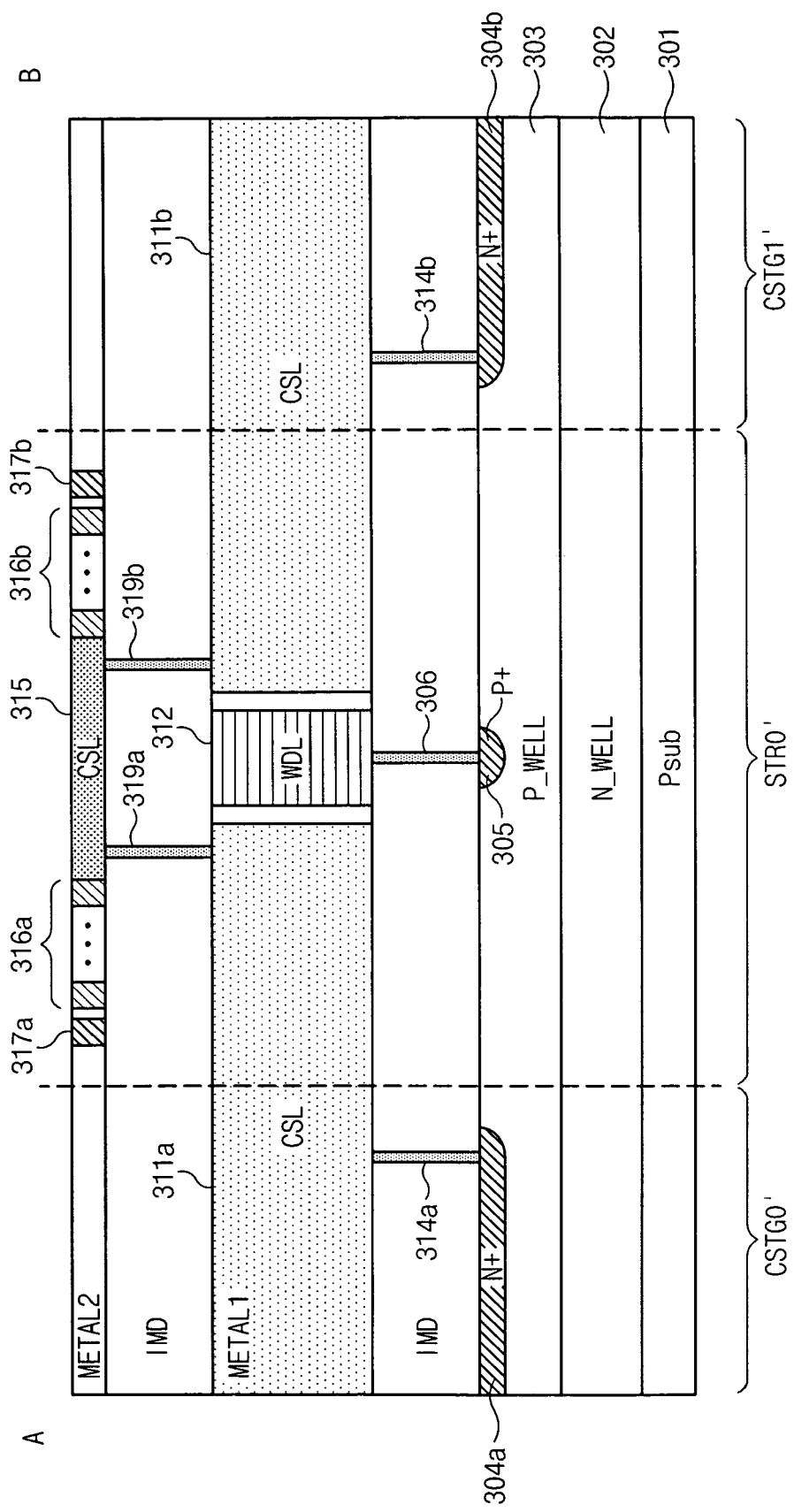
FIGS. 7 and 8 are diagrams showing a vertical section of the memory cell array with respect to A–B section and C–D section shown in FIG. 6.
Figure 8:
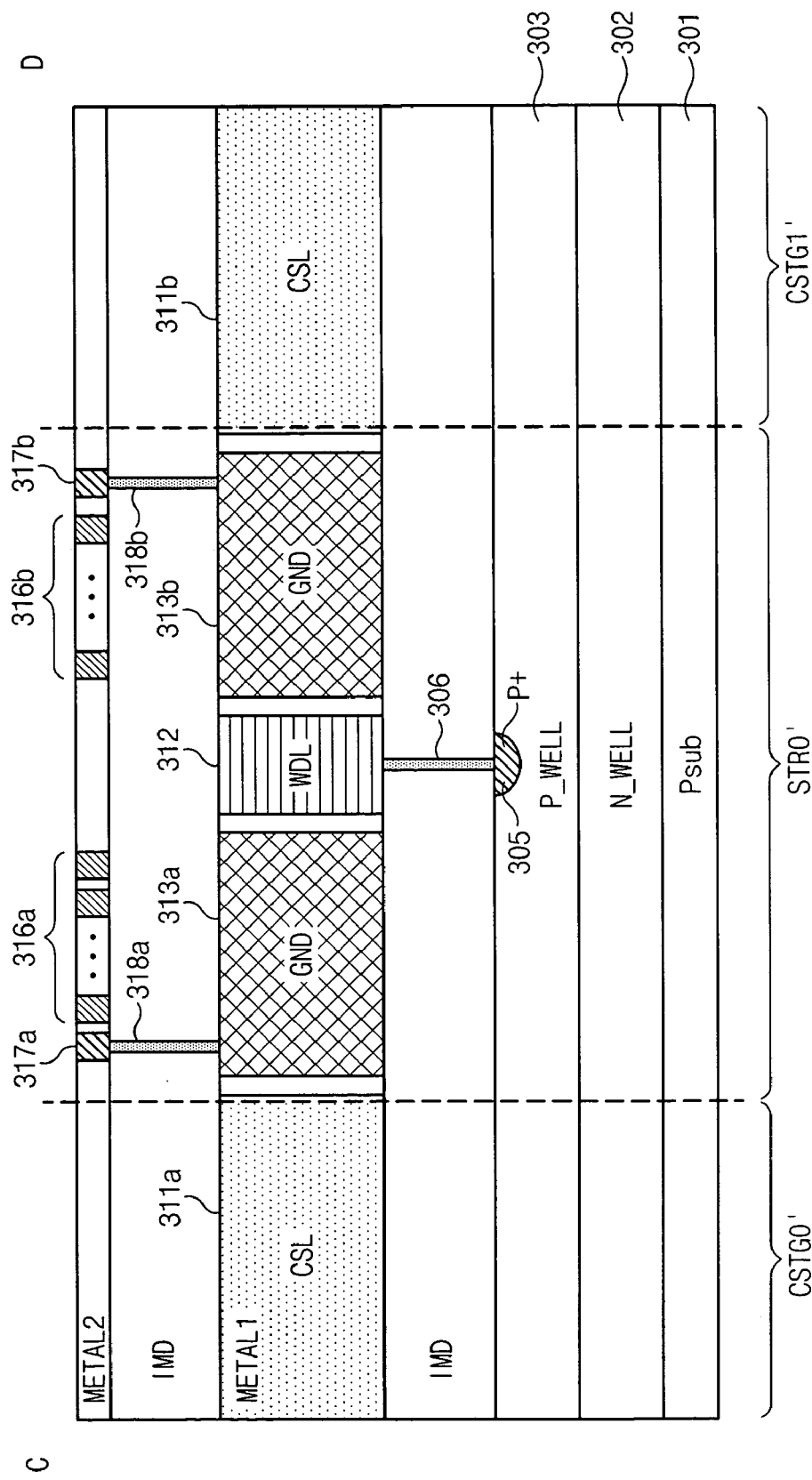

FIGS. 7 and 8 show a vertical section of the memory cell array with respect to A–B section and C–D section shown in FIG. 6. FIGS. 7 and 8 are vertical section views with respect to a cell string region CST disposed in two cell string groups CSTG0' and CSTG1', and one strapping region STR0' between the cell strings groups CSTG0' and CSTG1'. The cutting direction is parallel with the direction of a word line (not shown) of the memory cell array 310. If a certain dummy region, that is, a certain strapping region is assigned in the memory cell array irrespective of a fabricating method or detail construction of a flash memory device, signal lines may be arranged over the strapping region according to an exemplary embodiment of the present invention.

Referring to FIGS. 6 to 8, interconnection of signal lines and connection relationship between the memory cell string groups CSTG0' and CSTG1' and strapping region STR0' are described. Referring to FIGS. 6 and 7, the memory cell string groups CSTG0' and CSTG1' and the strapping region STR0' are constructed by stacking up an N-type well region 302 and a P-type well region 303 on a P-type substrate 301. The N-type well region 302 and a P-type well region 303 have a certain impurity concentration, respectively. In FIG. 7, N+ regions doped with high-concentration N-type impurities are isolated to be formed in the memory cell string groups CSTG0' and CSTG1'. Each of N+ regions is connected to a bit line (not shown) made of materials such as aluminum, through contact holes 314a and 314b. The N+ regions 304a and 304b shown in FIG. 7 may function as a source region of a selection transistor (not shown) of the memory cell string as well as a buried common source line CSL. The N+ regions 304a and 304b are connected to the first metal layer METAL 1 located over the P-type well region 303, through the contacts 314a and 314b. An intermetal dielectric (IMD) is formed between the P-type well region and the first metal layer METAL 1. In one exemplary embodiment of the present invention, the first metal layer METAL 1 covers a part of the strapping region STR0' and an entire upper portion of memory cell string groups CSTG0' and CSTG1'.

The strapping region STR0' is comprised of a stacked structure of the N-type well region 302 and the P-type well region 303, which have a certain impurity concentration on the P-type substrate 301. The structure of the strapping region STR0' is substantially similar to that of the memory cell string groups CSTG0' and CSTG1'. However, the N+ regions are not included on the P-type well region 303 of the strapping region STR0'. In other words, the memory cell string groups CSTG0' and CSTG1' are capable of substantially performing programming/erasing of data by using an active region where electrons can move. Since the strapping region STR0' does not have the active region, performing an interconnection function that connects memory cell string groups (CSTG0', CSTG1', . . . ) is allowed in the strapping region STR0'.

P+ region 305 doped with a high-concentration P-type impurity is isolated to be formed in the P-type well region 303 formed in the strapping region STR0'. The P-type region 305 is connected to the well drive line WDL 312 formed in the first metal layer through the contact 306. The well drive line WDL 312 may prevent voltage drop during programming/erasing of the flash memory. The well drive line WDL 312 may increase a memory size and provide a uniform voltage. The strapping region STR0' of FIG. 7 includes common source regions 311a and 311b formed in the first metal layer METAL 1, and the well drive line WDL 312. A plurality of signal lines 316a, 316b, 317a and 317b formed in the second metal layer METAL 2 are arranged over the common source regions 311a and 311b of the strapping region STR0'. In another exemplary embodiment of the present invention, as shown in FIG. 8, the signal lines 316a, 316b, 317a and 317b are arranged over the ground regions 313a and 313b. The IMD being an interlayer material is formed between the first metal layer METAL 1 and the second metal layer METAL 2.

The common source region 315 formed in the second metal layer METAL 2 is formed over the well drive line WDL 312. The well drive line WDL 312 is formed in the first metal METAL 1. The common source region 315 in the second metal layer METAL 2 is connected to the common source regions 311a and 311b formed in the first metal layer METAL 1, through a plurality of contacts 319a and 319b. A plurality of signal lines 316a, 316b, 317a and 317b can be located across the memory cell array 310 along the strapping region STR0'. Thus, the signal lines 316a, 316b, 317a and 317b can be arranged without assigning additional signal line region on a memory chip for transmitting/receiving signals and data between a control logic located under the memory cell array 310 and a peripheral logic located over the memory cell array 310. As a result, spaces occupied by the signal lines 316a, 316b, 317a and 317b on the memory chip can be minimized, and highly integrated flash memory device and efficient space usage can be accomplished. Therefore, signal delay caused by different length of the signal lines 316a, 316b, 317a and 317b can be prevented, and cut-down version can be embodied.

According to an exemplary embodiment of the present invention, the signal lines 316a, 316b, 317a and 317b can be shield to minimize interference between the each of the signal lines 316a, 316b, 317a and 317b and the memory cells. The construction for shielding the signal lines 316a, 316b, 317a and 317b arranged in the strapping region STR0' is described as follows.

The structure of FIG. 8 is substantially similar to that of FIG. 7 except that the ground regions 313a and 313b are formed instead of the common source regions 311a and 311b in the strapping region STR0'. The ground lines 317a and 317b are connected to the ground regions 313a and 313b through the contacts 318a and 318b for shielding.

Referring to FIGS. 6 and 8, a plurality of signal lines 316a, 316b, 317a and 317b formed in the second metal layer METAL 2 are arranged over the ground regions 313a and 313b. The ground regions 313a and 313b are formed in the first metal layer METAL 1 along the strapping region STR0'. In other words, the plurality of signal lines 316a, 316b, 317a and 317b traverse the memory cell array up and down. The plurality of signal lines 316a, 316b, 317a and 317b include ground lines 317a and 317b and a group of signal lines 316a and 316b. The group of signal lines 316a and 316b include one or more control lines and/or one or more data lines. The ground lines 317a and 317b in the second metal layer METAL 2 are connected to the ground regions 313a and 313b formed in the first metal layer METAL 1 through a plurality of contacts 318a and 318b. The signal lines 316a and 316b may not be connected to the ground regions 313a and 313b. Each of control lines or data lines included in the group of signal lines 316a and 316b may be arranged at a uniform distance.

Data interference and noise between the memory cell array and signal lines 316a, 316b, 317a and 317b can be prevented. Since each of signal lines 316a, 316b, 317a and 317b may be arranged at a uniform distance, the interference between the signal lines 316a, 316b, 317a and 317b can be prevented.

According to an exemplary embodiment of the present invention, signal lines arranged between a peripheral logic and a control logic of a semiconductor device can be arranged across a memory cell. As a result, high density integration of semiconductor device and easy embodiment of cut-down version can be achieved.

Preferably, each of signal lines may have a uniform length, and thereby preventing a skew caused by length differences between the signal lines. The uniform length of the signal lines may help predicting a precise signal transformation.

The signal lines can be shield using a metal in a lower layer of the signal lines so that data interference between a memory cell array and the signal lines can be minimized. The interference between mutual signal lines can be reduced by maintaining a distance between the signal lines.

Although exemplary embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. For example, previous description has been described in terms of the NAND-type flash memory. Alternatively, a NOR-type flash memory is applicable. Furthermore, if exemplary embodiments of the present invention are related to a memory device where a certain strapping region is formed in the memory cell array, it is applicable to a memory device where a type or a fabricating process of the memory device is not relevant.

What is claimed is:

1. A semiconductor memory device comprising:
    a memory cell array including a plurality of data storage regions having a plurality of memory cells and a plurality of dummy regions occupying space between the plurality of data storage regions;
    at least one peripheral logic arranged around the memory cell array; and
    a control logic for controlling operations of the peripheral logic, wherein a plurality of signal lines for connecting the peripheral logic and the control logic are arranged in the plurality of dummy regions, and the plurality of dummy regions comprise a common source region connected to a common source line of the memory cell array and a ground region for shielding the plurality of signal lines,
    wherein the common source region and the ground region are formed in a first metal layer.

2. The semiconductor memory device of claim 1, wherein the plurality of signal lines comprises:
    one ground line connected to the ground region; and
    one or more data lines, and one or more control lines.

3. The semiconductor memory device of claim 2, wherein the plurality of signal lines have a regular length to predict a signal transformation with respect to each of the signal lines.

4. The semiconductor memory device of claim 2, wherein the plurality of signal lines are formed in a second metal layer.

5. The semiconductor memory device of claim 4, wherein the second metal layer further comprises a common source region connected to the common source region formed in the first metal layer through a plurality of contacts.

6. The semiconductor memory device of claim 1, wherein the memory cell array is a flash memory cell array.

7. The semiconductor memory device of claim 1, wherein the plurality of data storage regions are a cell string group of a flash memory including a plurality of memory cell strings comprising a plurality of memory cells.

8. A memory cell array comprising:
    a plurality of data storage regions comprising a plurality of memory cells; and
    a plurality of signal transfer regions connected to a common source line of the plurality of data storage regions, wherein a plurality of signal lines are arranged in each of the plurality of signal transfer regions, and the signal transfer regions comprise a common source region connected to the common source line of the plurality of data storage regions and a ground region for shielding the plurality of signal lines,
    wherein the common source region and the ground region are formed in a first metal layer.

9. The memory cell array of claim 8, wherein the plurality of signal lines comprise:
    one ground line connected to the ground region; and
    one or more control lines, and one or more data lines.

10. The memory cell array of claim 9, wherein the plurality of signal lines have a regular length to predict a signal transformation with respect to each of the plurality of signal lines.

11. The memory cell array of claim 9, wherein the plurality of signal lines are formed in a second metal layer.

12. The memory cell array of claim 11, the second metal layer further includes a common source region connected to the common source region included in the first metal layer through a plurality of contacts.

13. The memory cell array of claim 8, wherein the memory cell array is a flash memory cell array.

14. The memory cell array of claim 8, wherein the plurality of data storage regions are a memory cell string group of a flash memory including a plurality of memory cell strings comprising a plurality of memory cells.

* * * * *